(12) United States Patent
Matsubara et al.

(10) Patent No.: US 11,859,286 B2
(45) Date of Patent: Jan. 2, 2024

(54) SEMICONDUCTOR MANUFACTURING APPARATUS AND MANUFACTURING METHOD OF SEMICONDUCTOR DEVICE

(71) Applicant: Kioxia Corporation, Tokyo (JP)

(72) Inventors: Yuya Matsubara, Yokkaichi (JP); Hiroshi Kubota, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 522 days.

(21) Appl. No.: 17/014,200

(22) Filed: Sep. 8, 2020

(65) Prior Publication Data
US 2021/0277520 A1 Sep. 9, 2021

(30) Foreign Application Priority Data
Mar. 9, 2020 (JP) .................. 2020-040150

(51) Int. Cl.
C23C 16/52 (2006.01)
H01J 37/32 (2006.01)
C23C 16/44 (2006.01)
C23C 16/46 (2006.01)
C23C 16/40 (2006.01)
C23C 16/26 (2006.01)
C23C 16/505 (2006.01)

(52) U.S. Cl.
CPC .............. C23C 16/52 (2013.01); C23C 16/26 (2013.01); C23C 16/402 (2013.01); C23C 16/4405 (2013.01); C23C 16/46 (2013.01); C23C 16/505 (2013.01); H01J 37/32192 (2013.01); H01J 37/32357 (2013.01); H01J 37/32449 (2013.01); H01J 37/32724 (2013.01); H01J 2237/335 (2013.01); H01J 2237/3321 (2013.01)

(58) Field of Classification Search
CPC ... C23C 16/26; C23C 16/402; C23C 16/4405; C23C 16/46; C23C 16/505; C23C 16/52; H01J 37/32192; H01J 37/32357; H01J 37/32449; H01J 37/32724
See application file for complete search history.

(56) References Cited

U.S. PATENT DOCUMENTS

| 2009/0250008 A1 | 10/2009 | Matsushima et al. |
| 2011/0048325 A1 | 3/2011 | Choi et al. |
| 2012/0048180 A1* | 3/2012 | Ito ........................ C30B 25/10 117/88 |
| 2015/0303054 A1* | 10/2015 | Hanashima ....... H01L 21/02274 438/758 |
| 2018/0197720 A1* | 7/2018 | Morikita ............ C23C 16/4557 |

FOREIGN PATENT DOCUMENTS

| JP | 4749785 B2 | 8/2011 |
| JP | 4972444 B2 | 7/2012 |
| JP | 2012-519956 A | 8/2012 |

* cited by examiner

Primary Examiner — Brook Kebede
(74) Attorney, Agent, or Firm — Oblon, McClelland, Maier & Neustadt, L.L.P.

(57) ABSTRACT

A semiconductor manufacturing apparatus according to the present embodiment includes a first gas feeder, a first gas processor and a second gas feeder. The first gas feeder is provided above a stage on which a substrate is to be placed and feeds a first gas to the substrate. The first gas processor supplies high frequency power to the stage and renders the first gas fed from the first gas feeder into plasma. The second gas feeder is provided above the stage and feeds a second gas more difficult to render into plasma than the first gas to an outer periphery of the first gas having been rendered into plasma.

6 Claims, 4 Drawing Sheets

SEMICONDUCTOR MANUFACTURING APPARATUS AND MANUFACTURING METHOD OF SEMICONDUCTOR DEVICE

CROSS REFERENCE TO RELATED APPLICATIONS

This application is based upon and claims the benefit of priority from the prior Japanese Patent Application No. 2020-040150, filed on Mar. 9, 2020, the entire contents of which are incorporated herein by reference.

FIELD

The embodiments of the present invention relate to a semiconductor manufacturing apparatus and a manufacturing method of a semiconductor device.

BACKGROUND

There are known methods of film deposition processing of a substrate, such as plasma CVD (Chemical Vapor Deposition).

There have however been cases where it is difficult to accurately adjust a film thickness, for example, to improve in-plane evenness of the film thickness.

DETAILED DESCRIPTION

Figure 1:
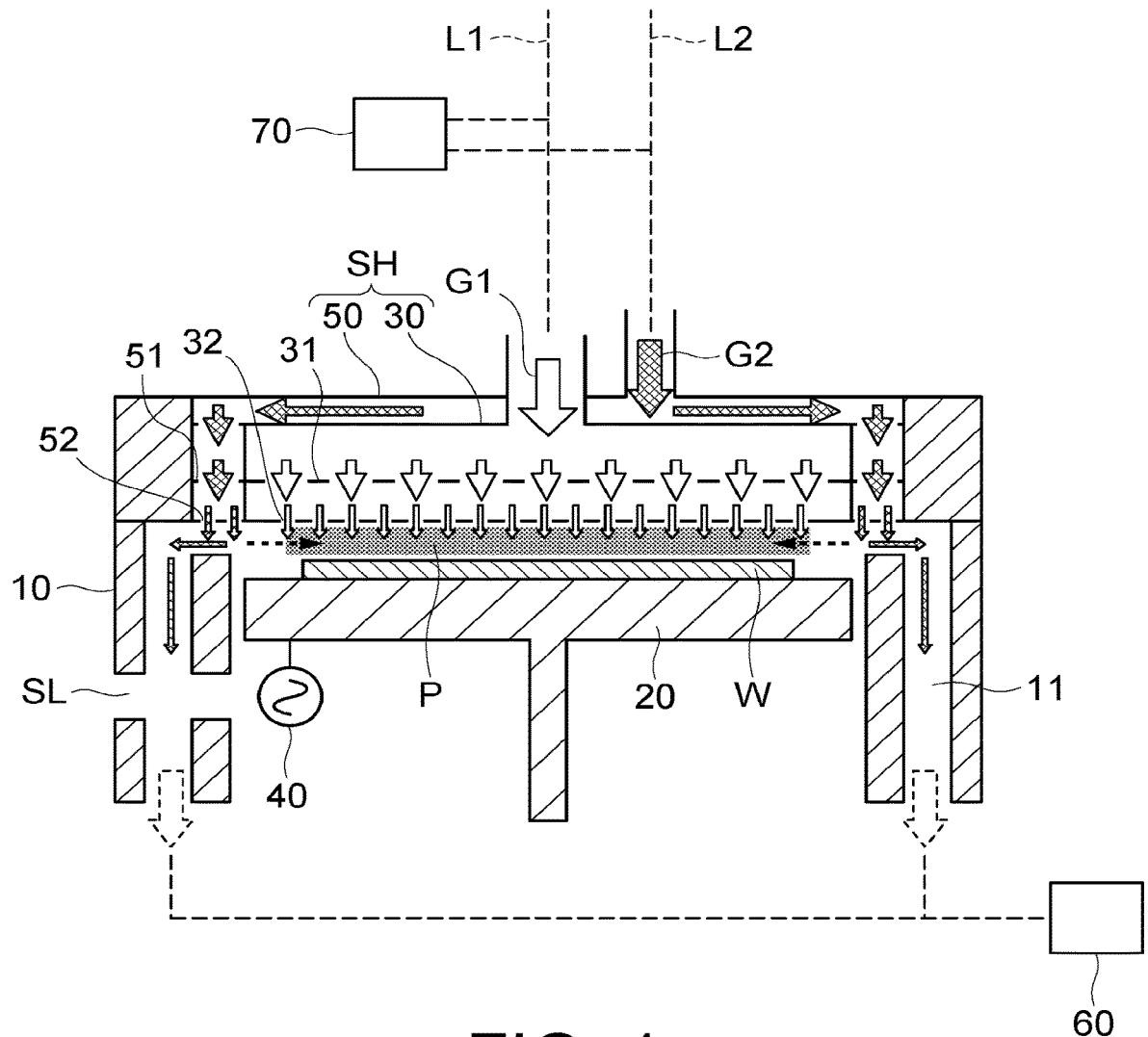
FIG. 1 is a schematic diagram showing a configuration of a semiconductor manufacturing apparatus according to a first embodiment.

Embodiments will now be explained with reference to the accompanying drawings. The present invention is not limited to the embodiments. In the embodiments, "an upper direction" or "a lower direction" refers to a relative direction when a direction perpendicular to a surface of a semiconductor substrate on which semiconductor elements are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor manufacturing apparatus according to the present embodiment includes a first gas feeder, a first gas processor and a second gas feeder. The first gas feeder is provided above a stage on which a substrate is to be placed and feeds a first gas to the substrate. The first gas processor supplies high frequency power to the stage and renders the first gas fed from the first gas feeder into plasma. The second gas feeder is provided above the stage and feeds a second gas more difficult to render into plasma than the first gas to an outer periphery of the first gas having been rendered into plasma.

First Embodiment

FIG. 1 is a schematic diagram showing a configuration of a semiconductor manufacturing apparatus according to a first embodiment. The semiconductor manufacturing apparatus is a plasma processing apparatus which processes a semiconductor substrate W using plasma, and exemplarily a plasma CVD (Chemical Vapor Deposition) apparatus.

The semiconductor manufacturing apparatus includes a chamber 10, a placement table (stage) 20, a gas feeder 30, a high frequency power supply 40, a gas feeder 50, a pump 60 and a controller 70. Notably, the gas feeder 30 and the gas feeder 50 function as one shower head SH.

The chamber 10 contains the semiconductor substrate W. Moreover, on the chamber 10, a slit SL for conveying the semiconductor substrate W is provided. Notably, FIG. 1 shows a part of the chamber 10.

On the stage 20, the semiconductor substrate W is placed on its upper surface. The stage 20 is provided in the chamber 10. The stage 20 has a heater for heating the semiconductor substrate W. Moreover, the stage 20 also functions as a lower electrode for plasma processing.

The gas feeder 30 is provided above the stage 20. The gas feeder 30 is opposite to the stage 20 via a processing space in the chamber 10. Moreover, the gas feeder 30 feeds a gas G1 to the semiconductor substrate W. Moreover, the gas feeder 30 (shower head SH) also functions as an upper electrode for plasma processing.

Moreover, the gas feeder 30 has a gas diffusion plate 31 and gas holes 32. As shown in FIG. 1, the gas feeder 30 has a plurality of gas holes 32.

The gas diffusion plate 31 has a plurality of gas holes. The gas G1 diffusively passes through the plurality of gas holes. Thereby, the gas G1 can be more evenly introduced into the processing space.

The gas holes 32 are provided in a region A1, out of an opposite surface to the semiconductor substrate W, the region being wider than semiconductor substrate W. Moreover, the gas G1 passes through the gas holes 32. Thereby, the gas feeder 30 introduces the gas G1 in a shower-like pattern into the processing space. Notably, details of the region A1 are described later with reference to FIG. 2.

In greater detail, the gas G1 contains a film deposition gas. The film deposition gas is exemplarily $C_3H_6$. Not limited to this, however, the film deposition gas may be exemplarily $C_2H_2$ or the like. That is, the gas G1 exemplarily contains at least one of $C_2H_2$ and $C_3H_6$. In this case, a carbon film is formed on the semiconductor substrate W. Moreover, in the gas G1, gas which assists discharge, such as argon (Ar), is exemplarily contained.

The high frequency power supply (RF power supply) 40 supplies high frequency power to the stage 20 and renders the gas G1 fed from the gas feeder 30 into plasma. The high frequency power supply 40 is connected to the stage 20 and generates high frequency power for plasma generation. The high frequency power supply 40 supplies the high frequency power between the gas feeder 30 which is the upper electrode and the stage 20 which is the lower electrode. Thereby, plasma P is generated on the semiconductor substrate W.

The gas feeder 50 is provided above the stage 20. The gas feeder 50 is opposite to the stage 20 via the processing space in the chamber 10. In greater detail, the gas feeder 50 is provided on an outer periphery of the gas feeder 30. Moreover, the gas feeder 50 feeds a gas G2 to an outer periphery of the gas G1 having been rendered into plasma (hereinafter occasionally also called plasma P). As shown in FIG. 1, a part of the gas G2 introduced into the chamber 10 progresses in a direction toward the center of the semiconductor substrate W. That is, the gas feeder 50 feeds the gas G2 so as to confine (keep) the plasma P to the side of the center part of the semiconductor substrate W. Moreover, the other part of the gas G2 progresses in a direction toward the outer periphery of the semiconductor substrate W, and may be directly sent to a discharge pipe 11 in the chamber 10.

An outer peripheral end part of the semiconductor substrate W has a curved shape. In this case, electric field concentration at the outer peripheral part of the semiconductor substrate W possibly causes change in voltage. Accordingly, there can be a case where the state of the plasma P is different from that at the center part of the semiconductor substrate W and causes difficulty in film thickness control at the outer peripheral part of the semiconductor substrate W.

Therefore, the gas feeder 50 controls, with the gas G2, the gas G1 having been rendered into plasma. For example, the gas G2 can restrain the plasma P from spreading to the outer periphery beyond the semiconductor substrate W to improve the density of plasma at the outer peripheral part of the semiconductor substrate W. This can increase the film thickness at the outer peripheral part of the semiconductor substrate W and improve in-plane evenness of the film thickness. Accordingly, the film thickness can be adjusted by the gas feeder 50.

In greater detail, the gas feeder 50 has a gas diffusion plate 51 and gas holes 52. As shown in FIG. 1, the gas feeder 50 has a plurality of gas holes 52.

The gas diffusion plate 51 has a plurality of gas holes. The gas diffusion plate 51 is similar to the gas diffusion plate 31.

The gas holes 52 are provided in a region A2, out of the opposite surface to the semiconductor substrate W, the region being on the outer periphery of the region A1. Moreover, the gas G2 passes through the gas holes 52. Thereby, the gas feeder 50 introduces the gas G2 in a shower-like pattern into the processing space. Notably, details of the region A2 are described later with reference to FIG. 2.

In greater detail, the gas G2 is more difficult to render into plasma than the gas G1. That is, the gas G2 is more difficult to ionize than the gas G1 and discharge therein is difficult to generate. Moreover, since the gas G2 is difficult to render into plasma (decompose), a distribution or a density of the plasma P can be controlled. The gas G2 is exemplarily $N_2$. Not limited to this, however, the gas G2 may be exemplarily $H_2$, $O_2$ or the like. That is, the gas G2 exemplarily contains at least one of $N_2$, $H_2$ and $O_2$.

Notably, a center axis of the stage 20 substantially coincides with center axes of the gas feeders 30 and 50.

Figure 2:
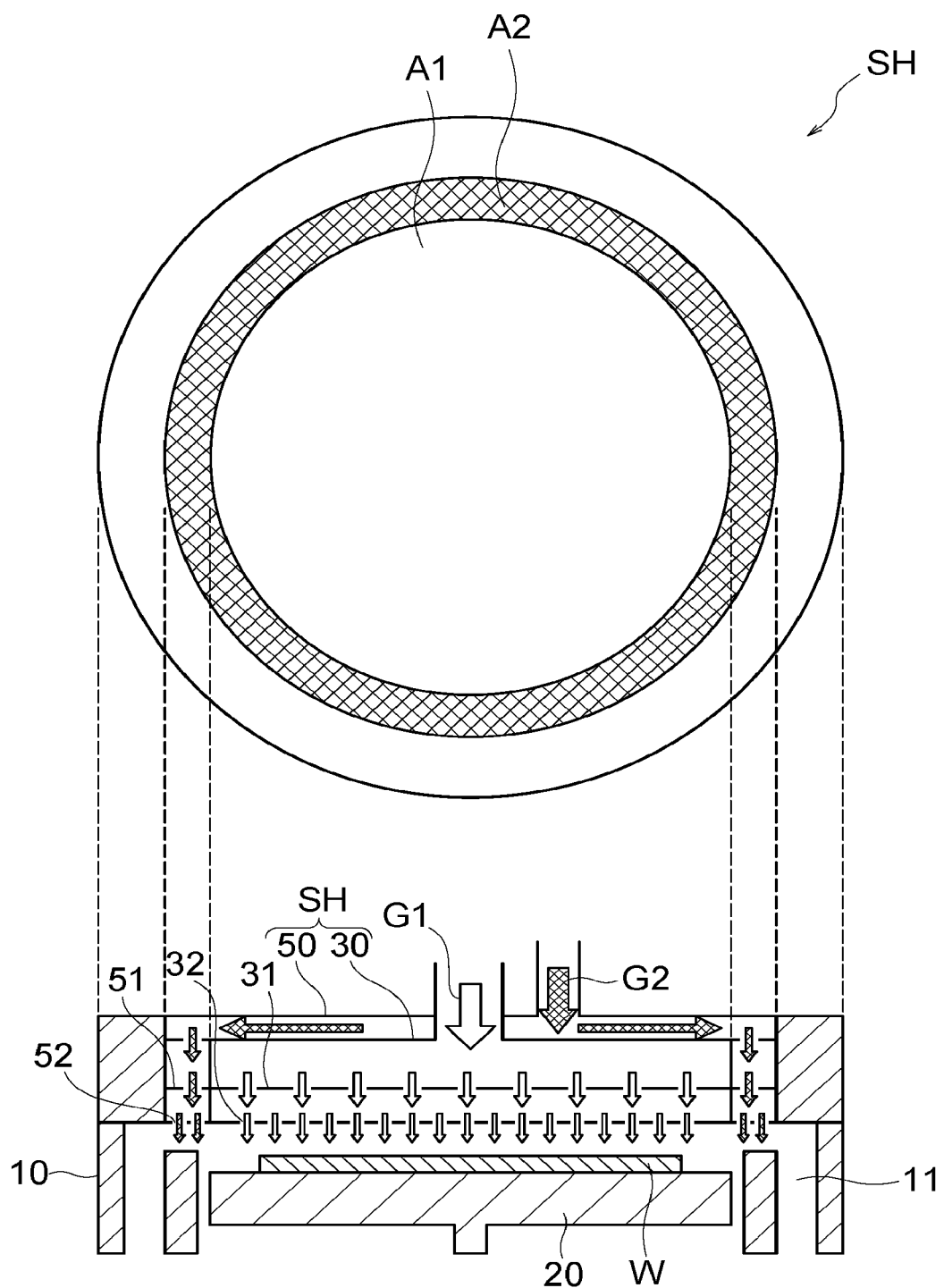
FIG. 2 is a diagram showing gas flow regions according to the first embodiment.

FIG. 2 is a diagram showing gas flow regions according to the first embodiment. The upper side of FIG. 2 shows the gas flow regions on the opposite surface of the shower head SH to the stage 20. The lower side of FIG. 2 shows a part of FIG. 1. As above, the region A1 is a region where the gas holes 32 are provided and the gas G1 is fed. As above, the region A2 on the outer periphery of the region A1 is a region where the gas holes 52 are provided and the gas G2 is fed. Moreover, as indicated by the broken lines, an outer diameter of the region A1 and an outer diameter of the gas feeder 30 correspond to each other and an outer diameter of the region A2 and an outer diameter of the gas feeder 50 correspond to each other between the upper side of FIG. 2 and the lower side of FIG. 2.

The outer diameter of the region A1 is preferably larger than the outer diameter of the semiconductor substrate W. Thereby, the gas G1 can be more evenly introduced onto the semiconductor substrate W to appropriately perform film deposition.

The outer diameter of the region A1 is exemplarily about 290 mm to about 320 mm. The outer diameter of the region A2 is exemplarily about 320 mm to about 360 mm. The outer diameter of the shower head SH is about 370 mm to about 410 mm. The outer diameter of the semiconductor substrate W is exemplarily about 300 mm.

As shown in FIG. 1, the pump 60 discharges gas in the chamber 10.

The controller 70 controls an amount of feed of the gas G2. Thereby, the distribution or the density of the plasma P above the semiconductor substrate W can be adjusted. In greater detail, the controller 70 controls the amount of feed of the gas G2 relative to an amount of feed of the gas G1. The reason is that the distribution of the gas G1 changes also depending on the flow rate (amount of feed) of the gas G1. The controller 70 may adjust the flow rate of the gas G1, for example, by controlling a valve (not shown) to be provided on a gas passage L1 on the upstream side of the gas feeder 30. The controller 70 may adjust the flow rate of the gas G2, for example, by controlling a valve (not shown) to be provided on a gas passage L2 on the upstream side of the gas feeder 50.

When the flow rate of the gas G2 increases from zero, a plasma P1 is confined on a center part of the semiconductor substrate W. Accordingly, as above, the density of the plasma P near the outer peripheral part of the semiconductor substrate W increases, and a film on the outer peripheral part of the semiconductor substrate W becomes thick. When the flow rate of the gas G2 further increases and the flow rate of the gas G2 relative to the flow rate of the gas G1 increases, the plasma P easily concentrates in the center part of the semiconductor substrate W from the outer peripheral part thereof. Accordingly, the density of the plasma P near the outer peripheral part of the semiconductor substrate W decreases, and the film on the outer peripheral part of the semiconductor substrate W becomes thin. Accordingly, by adjusting the flow rates of the gases G1 and G2, the film thickness can be adjusted so as to be a desired film thickness. Flow rates of $C_3H_6$ and Ar of the gas G1 are exemplarily 300 sccm and 1500 sccm, respectively. Moreover, a flow rate of $N_2$ of the gas G2 is exemplarily 1500 sccm.

Next, operation of the semiconductor manufacturing apparatus is described.

Figure 3:
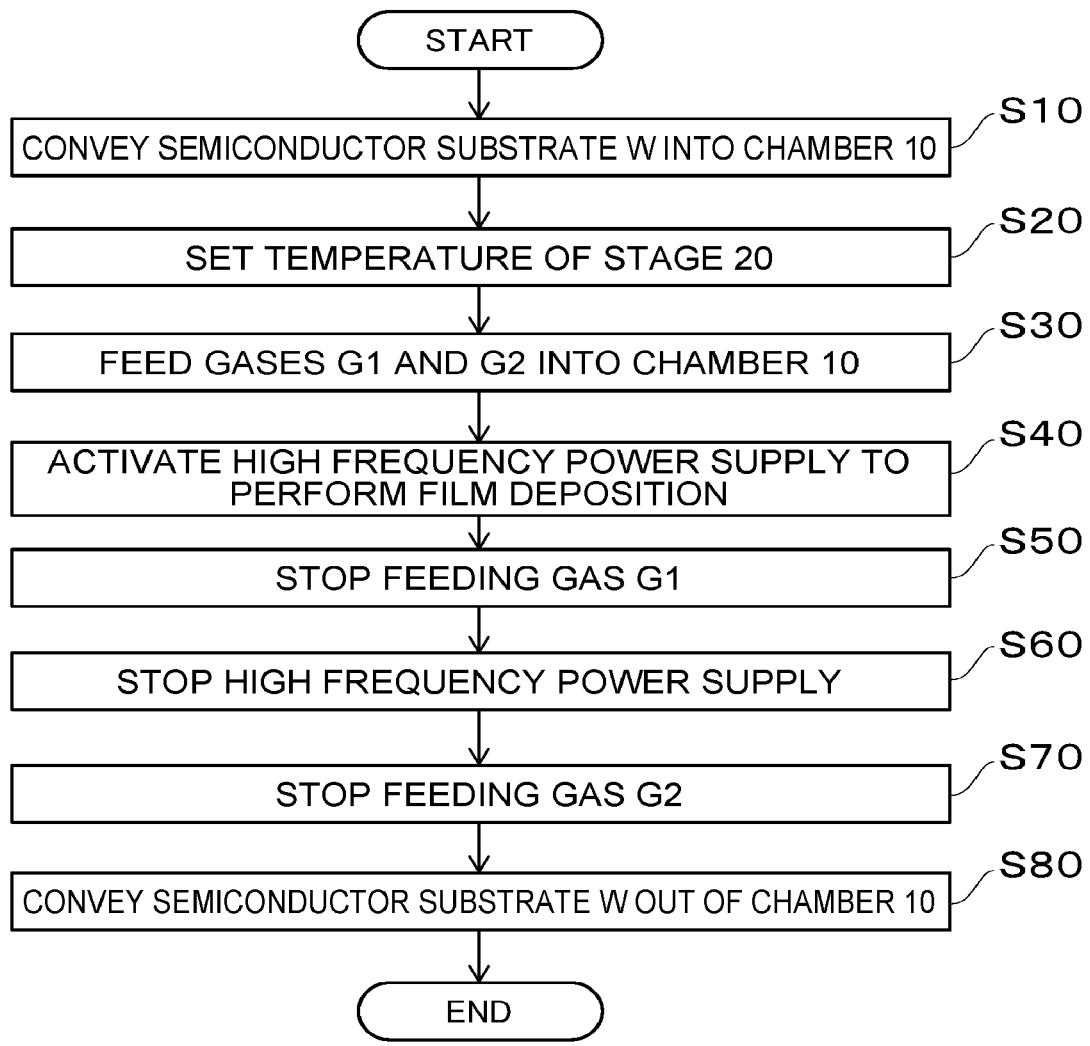
FIG. 3 is a flowchart showing a manufacturing method of a semiconductor device according to the first embodiment.

FIG. 3 is a flowchart showing a manufacturing method of a semiconductor device according to the first embodiment.

First, the semiconductor substrate W is conveyed into the chamber 10 of a plasma CVD apparatus (not shown) (S10). Next, a temperature of the stage 20 is set (S20).

Next, the gas feeders 30 and 50 feed the gases G1 and G2 into the chamber 10 (S30). That is, the gas feeders 30 and 50 feed the gas G1 to the semiconductor substrate W from an upper portion above the stage 20 on which the semiconductor substrate W is placed and feed the gas G2 more difficult to render into plasma than the gas G1 to the outer periphery of the gas G1 from an upper portion above the stage 20. In greater detail, the controller 70 controls the amount of feed of the gas G2 relative to the amount of feed of the gas G1 and the gas feeders 30 and 50 feed the gas G1 and the gas G2.

Next, the high frequency power supply 40 is activated to supply the high frequency power to the stage 20 (S40). That is, the high frequency power supply 40 supplies the high frequency power to the stage 20, and thereby, renders the gas G1 fed from the upper portion above the stage 20 into plasma. Thereby, a carbon film is formed.

Next, the gas feeder 30 stops feeding the gas G1 (S50). Next, the high frequency power supply 40 stops supplying the power (S60). For example, the high frequency power supply is stopped after all of the gas G1 completes flowing out from the chamber 10. Next, the gas feeder 50 stops feeding the gas G2 (S70). Next, the semiconductor substrate W is conveyed out of the chamber 10 (S80).

Notably, feeding $C_3H_6$ of the gas G1 may be stopped in step S50 and feeding Ar of the gas G1 may be stopped in step S70.

As above, according to the first embodiment, the gas feeder 50 is provided above the stage 20 and feeds the gas G2 to the outer periphery of the gas G1 having been rendered into plasma. Thereby, the distribution or the density of the plasma P can be adjusted such that the plasma P is confined to the side of the center part of the semiconductor substrate W. As a result, the film thickness can be adjusted.

Moreover, the gas feeder 50 feeds the gas G2 downward from an upper portion above the stage 20.

There can be a case where it is difficult to cause the gas G2 to flow substantially evenly with respect to the substrate due to the slit SL if the gas G2 is fed from a lower part of the chamber 10. This can cause a case where film thickness control is difficult.

On the contrary, according to the first embodiment, the gas feeder 50 feeds the gas G2 downward from the upper portion above the stage 20. Thereby, the influence of the slit SL can be restrained, in-plane evenness of the film thickness can be improved, and film thickness control can be made easier.

Moreover, the high frequency power supply 40 supplies the high frequency power to the stage 20. Thereby, the gas G2 can be more restrained from being rendered into plasma than in the case of supplying high frequency power to the gas feeder 30 side (shower head side).

As a method of controlling the film thickness at the outer peripheral part of the semiconductor substrate W, there is known changing the shape of the stage 20. Nevertheless, it is occasionally difficult in this case to perform film deposition under a plurality of film deposition conditions on one stage. Accordingly, another stage is needed to use in order to change a film deposition condition to another. Furthermore, it is occasionally hard to change the film deposition condition due to the stage being expensive.

Moreover, as another method of controlling the film thickness at the outer peripheral part of the semiconductor substrate W, there is known controlling the plasma P through electric field control by newly providing electrodes on the outer peripheral part in the stage. Nevertheless, in this case, abnormal discharge possibly tends to arise at the outer peripheral part of the semiconductor substrate W during film deposition. Moreover, another stage is needed to use in order to change a film deposition condition to another.

On the contrary, according to the first embodiment, feeding the gas G2 enables the film thickness at the outer peripheral part of the semiconductor substrate W to be more easily adjusted without such tendency of abnormal discharge to arise. Moreover, since the film deposition condition can be changed by adjusting the flow rates of the gases G1 and G2, the film deposition condition can be easily changed.

(Modification 1)

Modification 1 is different from the first embodiment in that a silicon oxide film ($SiO_2$), in place of a carbon film, is deposited on the semiconductor substrate W.

The gas G1 contains at least one of TEOS (Tetraethyl Orthosilicate), $SiH_4$, $O_2$ and $N_2O$. In greater detail, the gas G1 is any one of TEOS and $O_2$, and $SiH_4$ and $N_2O$. That is, the gas G1 may be a combination of TEOS and $O_2$ or may be a combination of $SiH_4$ and $N_2O$. In this case, a silicon oxide film is deposited on the semiconductor substrate W.

The gas G2 exemplarily contains $N_2$.

The semiconductor manufacturing apparatus according to Modification 1 can obtain the similar effects to those of the first embodiment.

Second Embodiment

Figure 4:
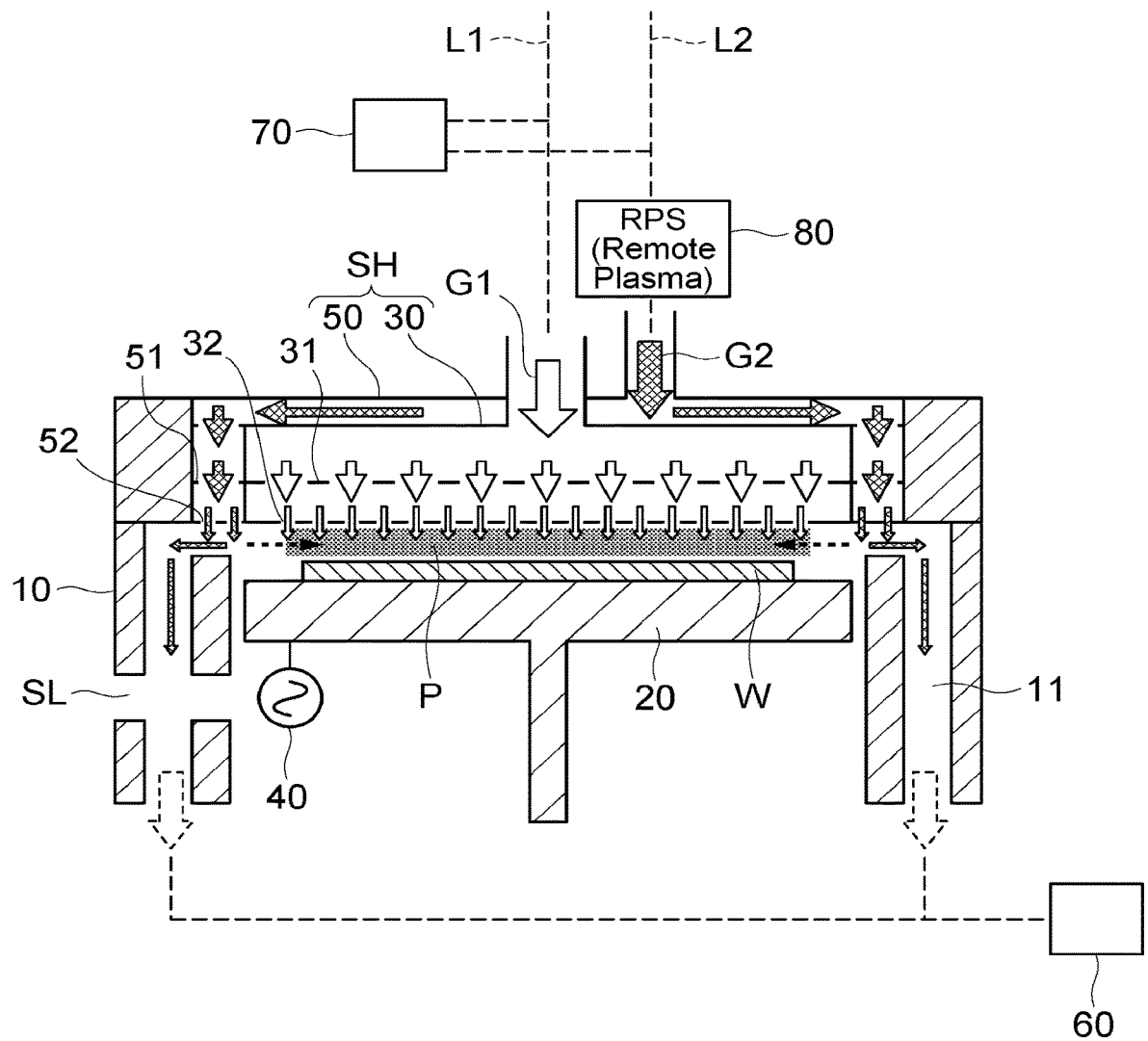
FIG. 4 is a schematic diagram showing a configuration of a semiconductor manufacturing apparatus according to a second embodiment.

FIG. 4 is a schematic diagram showing a configuration of a semiconductor manufacturing apparatus according to a second embodiment. The second embodiment is different from the first embodiment in that a cleaning gas is fed during film deposition.

The gas G2 contains a cleaning gas. The cleaning gas is also more difficult to render into plasma than the gas G1 and the distribution or the density of the plasma P can be adjusted.

The semiconductor manufacturing apparatus further includes an RPS (Remote Plasma Source) 80.

The RPS 80 is provided on a gas passage L2 on the upstream side of the gas feeder 50. Moreover, the RPS 80 processes the cleaning gas with plasma. The RPS 80 generates radical gas, for example, by microwave discharge. Notably, since a part of the cleaning gas is introduced into the processing space without undergoing plasma processing, the distribution or the density of the plasma P can be adjusted.

The gas G1 is a gas containing carbon. Similarly to the first embodiment, the gas G1 is exemplarily $C_3H_6$ or the like. In this case, a carbon film is deposited on the semiconductor substrate W.

In greater detail, the cleaning gas is exemplarily $O_2$. During film deposition on the semiconductor substrate W, the gas G1 causes unwanted carbon films to be deposited also in the interior of the chamber 10. There can be accordingly a case of removing such carbon films in the chamber 10 after the film deposition. Oxygen radical gas generated from $O_2$ being processed by the RPS 80 reacts with the carbon films and removes the carbon films. Accordingly, carbon films in the discharge pipe 11 which the oxygen radical gas passes through during the film deposition on the semiconductor substrate W can be removed. This can more reduce carbon films in the discharge pipe 11 and more reduce the time required for cleaning the interior of the chamber 10 than in the first embodiment.

The other configuration of the semiconductor manufacturing apparatus according to the second embodiment is similar to the corresponding configuration of the semiconductor manufacturing apparatus according to the first embodiment, and its detailed description is omitted.

The semiconductor manufacturing apparatus according to the second embodiment can obtain the similar effects to those of the first embodiment.

(Modification 2)

Modification 2 is different from the second embodiment in that a silicon oxide film, in place of a carbon film, is deposited on the semiconductor substrate W.

The gas G1 is a gas containing silicon. Notably, the gas G1 may be similar to that in Modification 1. In this case, a silicon oxide film is deposited on the semiconductor substrate W.

In greater detail, the cleaning gas is exemplarily $NF_3$. During film deposition on the semiconductor substrate W, the gas G1 causes unwanted silicon oxide films to be deposited also in the interior of the chamber 10. There can be accordingly a case of removing such silicon oxide films in the chamber 10 after the film deposition. Fluorine radical gas generated from $NF_3$ being processed by the RPS 80 reacts with the silicon oxide films and removes the silicon oxide films. Accordingly, silicon oxide films in the discharge pipe 11 which the fluorine radical gas passes through during the film deposition on the semiconductor substrate W can be removed. This can more reduce silicon oxide films in the discharge pipe 11 and more reduce the time required for cleaning the interior of the chamber 10 than in the second embodiment.

The semiconductor manufacturing apparatus according to the Modification 2 can obtain the similar effects to those of the second embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
   a first gas feeder provided above a stage on which a substrate is to be placed and configured to feed a first gas to the substrate;
   a first gas processor configured to supply high frequency power to the stage and render the first gas fed from the first gas feeder into plasma; and
   a second gas feeder provided above the stage and configured to feed a second gas more difficult to render into plasma than the first gas to an outer periphery of the first gas having been rendered into plasma, wherein
   the second gas contains a cleaning gas, the apparatus further comprising
   a second gas processor provided on a gas passage on an upstream side of the second gas feeder and configured to process the cleaning gas with plasma.

2. The semiconductor manufacturing apparatus according to claim 1, wherein
   the first gas is a gas containing carbon, and
   the cleaning gas is $O_2$.

3. The semiconductor manufacturing apparatus according to claim 1, wherein
   the first gas is a gas containing silicon, and
   the cleaning gas is $NF_3$.

4. A semiconductor manufacturing apparatus comprising:
   a first gas feeder provided above a stage on which a substrate is to be placed and configured to feed a first gas to the substrate;
   a first gas processor configured to supply high frequency power to the stage and render the first gas fed from the first gas feeder into plasma;
   a second gas feeder provided above the stage and configured to feed a second gas more difficult to render into plasma than the first gas to an outer periphery of the first sas having been rendered into plasma; and
   a controller configured to control an amount of feed of the second gas relative to an amount of feed of the first gas, wherein
   the second gas contains a cleaning gas, the apparatus further comprising
   a second gas processor provided on a gas passage on an upstream side of the second gas feeder and configured to process the cleaning gas with plasma.

5. The semiconductor manufacturing apparatus according to claim 4, wherein
   the first gas is a gas containing carbon, and
   the cleaning gas is $O_2$.

6. The semiconductor manufacturing apparatus according to claim 4, wherein
   the first gas is a gas containing silicon, and
   the cleaning gas is $NF_3$.

* * * * *